(12) United States Patent
He et al.

(10) Patent No.: US 7,631,686 B2
(45) Date of Patent: *Dec. 15, 2009

(54) LIQUID COOLING DEVICE

(75) Inventors: Li He, Shenzhen (CN); Tsung-Lung Lee, Tu-Cheng (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 477 days.

This patent is subject to a terminal disclaimer.

(21) Appl. No.: 11/211,985

(22) Filed: Aug. 25, 2005

(65) Prior Publication Data
US 2007/0044943 A1    Mar. 1, 2007

(51) Int. Cl.
H05K 7/20 (2006.01)
F28D 15/00 (2006.01)

(52) U.S. Cl. .................. 165/104.33; 165/104.14; 165/104.26; 361/700

(58) Field of Classification Search .......... 165/104.33, 165/104.34, 80.2, 80.3, 80.4, 80.5, 104.21, 165/104.26, 104.14; 361/397, 701, 702, 361/703, 699, 687, 700
See application file for complete search history.

(56) References Cited

U.S. PATENT DOCUMENTS 3,604,504 A * 9/1971 Kessler et al. .................. 165/46
4,402,358 A * 9/1983 Wolf ........................... 165/276
4,854,377 A 8/1989 Komoto et al.
4,951,740 A * 8/1990 Peterson et al. ............. 165/276
5,285,347 A 2/1994 Fox et al.
7,019,973 B2 * 3/2006 Rivera ......................... 361/700
7,353,862 B2 * 4/2008 He et al. ................. 165/104.33
2001/0023871 A1 * 9/2001 Bayliss ....................... 220/707
2003/0214783 A1 * 11/2003 Narakino et al. ............ 361/687
2004/0011511 A1 * 1/2004 Ghosh et al. ............ 165/104.21
2004/0042176 A1 * 3/2004 Niwatsukino et al. ....... 361/699
2004/0123978 A1 * 7/2004 Hashimoto et al. ......... 165/80.3
2004/0136160 A1 * 7/2004 Lee et al. .................... 361/697

FOREIGN PATENT DOCUMENTS

CN   2612070 Y   4/2004
TW   555073      9/2003

* cited by examiner

Primary Examiner—Cheryl J Tyler
Assistant Examiner—Brandon M Rosati
(74) Attorney, Agent, or Firm—Frank R. Niranjan

(57) ABSTRACT

A liquid cooling device (10) includes a heat sink (12), a reservoir (14) distant from the heat sink, a duct (16) connecting with the reservoir, a flexible tube (18) connected to the duct and the heat sink, and a heat-transfer member (19) in the liquid cooling device. The liquid cooling device is filled with liquid therein. The heat-transfer member is a heat pipe including an evaporating segment (192) fixed to the heat sink and a condensing segment (194) extending freely in the reservoir.

16 Claims, 4 Drawing Sheets

LIQUID COOLING DEVICE

BACKGROUND

1. Field

The present invention relates to a liquid cooling device, and more particularly to a liquid cooling device used to cool a heat-generating device mounted within a computer system.

2. Related Art

Boom of electronic technology promotes quick evolutions and rife applications of computers. Nowadays, personal computers are prevalently used in a variety of fields concerning study, work and life of human. A central processing unit (CPU) is a core of a computer system, as we know. Computers are ceaselessly updated to have the CPUs in higher frequency and higher speed. CPUs of these computers accordingly generate an increasing amount of heat which must be timely removed to enable the CPUs to retain stable operation.

Recently, some kinds of liquids are widely used as heat-transfer media contained in cooling devices to convey heat from one place to another place. Water is a preferred example of the kinds of liquids, because water has great specific heat and does not contaminate environment. Another reason for water being popular in liquid cooling system is that water has a low cost.

Taiwan Patent Issue No. 555073 disclosed a liquid cooling device. The cooling device comprises a heat absorbing box for containing liquid therein, a pump and pipes connecting the pump to the box to form a liquid circulation loop. A plurality of ribs is formed in the box to enhance heat-exchange between the liquid and the box. Unfortunately, the box itself is too small in volume to provide enough heat-exchange area. Additionally, most heat absorbed by the box is dissipated to environment by means of circulation of the liquid; thus, speed of the heat dissipation is restrained.

China Patent Issue No. 2612070 also taught a liquid cooling device. The cooling device provides a larger heat-exchange area in comparison with the cooling device disclosed in Taiwan Patent Issue No. 555073. However, the cooling device is heavy, and its weight is totally exerted to a printed circuit board on which the cooling device is positioned. The printed circuit board is subject to damage as a result of the overload of the cooling device. Secondly, heat-convey pipes in the cooling device are designed to exchange heat with a heat sink by repeatedly extending through the heat sink, whereby the heat-convey pipes must be formed with a large number of U-turns. Such a design makes the heat-convey pipes expansive and makes the assembly between the heat-convey pipes and the heat sink difficult and laborious. Furthermore, the U-turns of the heat-convey pipes are subject to corrosion since they create areas of stress concentration.

Moreover, each of the cooling devices above-mentioned utilizes a pump to enhance the circulation of the liquid in the cooling devices. Pumps are expensive devices, and consume power when operate.

SUMMARY

Accordingly, what is needed is a liquid cooling device which is easily to be constructed at a low cost while the liquid cooling device can effectively remove heat from a heat-generating device.

A liquid cooling device in accordance with a preferred embodiment of the present invention comprises a heat sink, a reservoir distant from the heat sink, a duct connecting with the reservoir, a flexible tube connected to the duct and the heat sink, and a heat-transfer member placed in the liquid cooling device. The duct and the flexible tube cooperatively connect the heat sink and the reservoir to form a hermetical container for containing liquid therein. The heat-transfer member comprises a heat-absorbing segment connected to the heat sink and a heat-discharging segment disposed in the reservoir and a medium segment between the heat-absorbing segment and the heat-discharging segment.

Other advantages and novel features will become more apparent from the following detailed description when taken in conjunction with the accompanying drawings, in which:

DETAILED DESCRIPTION OF THE PREFERRED EMBODIMENT

Figure 1:
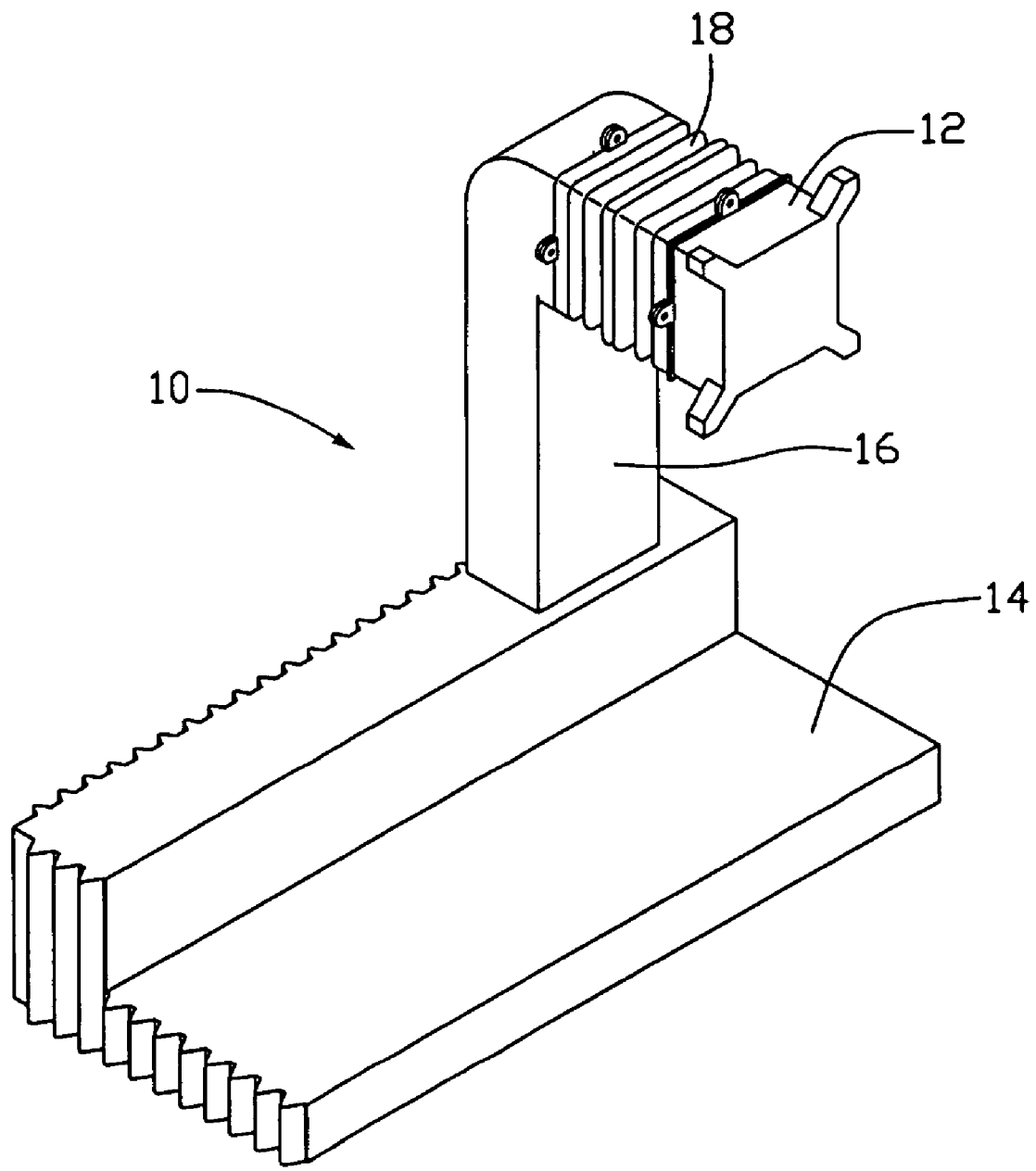
FIG. 1 is an assembled, isometric view of a liquid cooling device in accordance with a preferred embodiment of the present invention.
Figure 2:
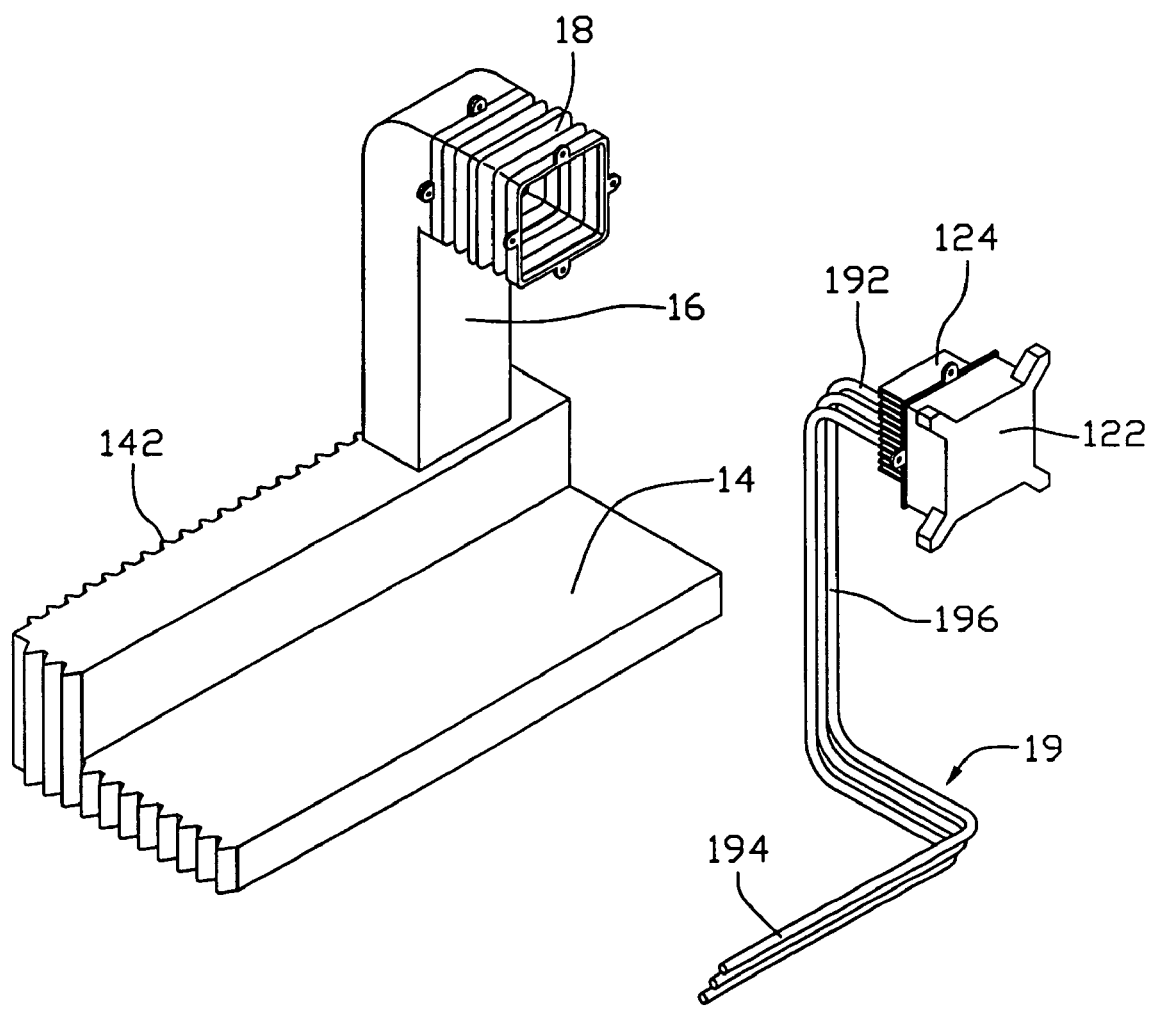
FIG. 2 is a partially exploded view of FIG. 1.
Figure 3:
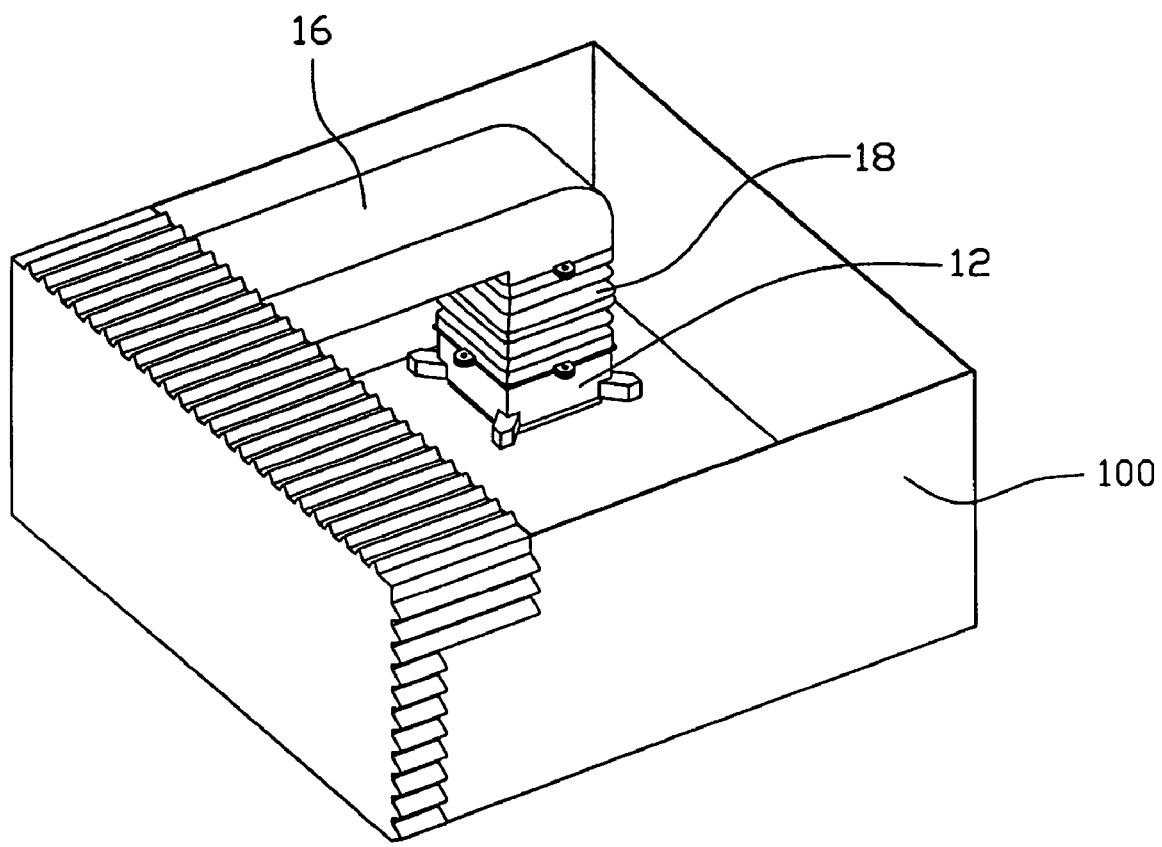
FIG. 3 is an isometric view of a use of the liquid cooling device of FIG. 1 to cool a heat-generating device in a computer casing.
Figure 4:
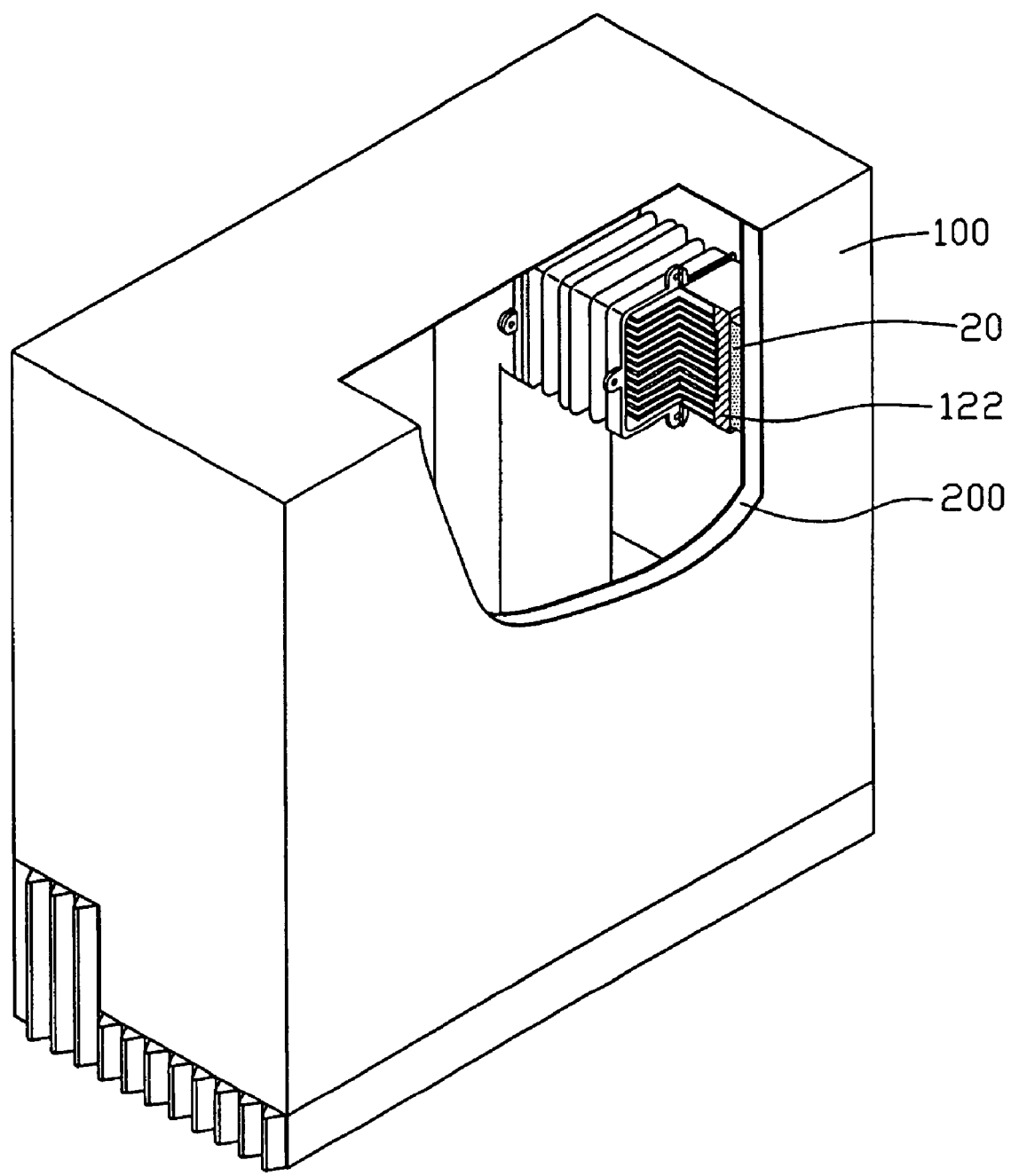
FIG. 4 is a view similar to FIG. 3, but viewed from another aspect and some parts being cut away to more clearly show a connection between the liquid cooling device and the heat-generating device.

Referring to FIGS. 1-4, a liquid cooling device 10 of a preferred embodiment of the invention comprises a heat sink 12, a reservoir 14, a duct 16, a flexible tube 18 and a heat-transfer member. In the preferred embodiment, the heat-transfer member comprises three heat pipes 19 (particularly see FIG. 2). The duct 16 is hermetically connected to the reservoir 14. The flexible tube 18 is hermetically connected to the duct 16. The heat sink 12 is hermetically connected to the flexible tube 18; thus, the liquid cooling device 10 is a hermetical liquid container. In the preferred embodiment, the heat sink 12 functions as a heat-receiving element, and the reservoir 14 functions as a heat-dissipating element.

The heat sink 12 comprises a tank 122 and a plurality of fins 124. The tank 122 comprises an outer surface (not labeled) which is attachable to a heat-generating device 20 mounted on a printed circuit board (PCB) 200 (see FIG. 4) for absorbing heat from the heat-generating device 20. The plurality of fins 124 (particularly see FIG. 2 and FIG. 4) is formed in the tank 122 and further extended out of the tank 122 in a direction away from the outer surface of the tank 122.

The reservoir 14 comprises a pair of connected chambers. The reservoir 14 has a large capability to contain liquid, such as water, in the reservoir 14. The reservoir 14 forms a plurality of protrusions 142 on a portion of an outer periphery of the reservoir 14 to enhance heat-exchange area of the reservoir 14, so that the reservoir 14 can sufficiently receive heat from the liquid contained in the reservoir 14 and adequately dissipate the heat to the ambient environment. The reservoir 14 can serve for a bottom wall of a computer casing 100 (particularly see in FIGS. 3-4) or can be placed outside the computer casing 100.

The duct 16 has an end portion thereof perpendicularly inserted into the reservoir 14, and another end portion thereof parallel to a plane that the reservoir extends 14.

The flexible tube 18 at an end portion thereof is connected to the duct 16. The flexible tube 18 at an opposite end portion thereof joints with the tank 122 and encloses the fins 124. Sealing pads (not shown) are arranged between the flexible tube 18 and the duct 16, and between the flexible tube 18 and the tank 122 to ensure that the liquid cooling device 10 is totally hermetical to an outside of the liquid cooling device 10.

Each heat pipe 19 comprises an evaporating segment 192 (heat-absorbing segment) disposed in the tank 122 and the flexible tube 18, a medium segment 194 disposed in the duct 16, and a condensing segment 196 (heat-discharging segment) disposed in the reservoir 14. In the preferred embodiment, the evaporating segment 192 is fixed to the fins 124 of the heat sink 12; the medium segment 194 and the condensing segment 196 are freely extended in the duct 16 and the reservoir 14 respectively.

The liquid cooling device 10 is totally filled with liquid, which is water in the embodiment. That means water fills the tank 122 of the heat sink 12, the reservoir 14, the duct 16 and the flexible tube 1; thus, in the embodiment the fins 124 and the heat pipes 19 are submerged in water.

In work of the liquid cooling device 10, the tank 122 of the heat sink 10 absorbs heat from the heat-generating device 20. The heat-generating device 20 in the preferred embodiment is an electronic device such as a CPU or an IC package. The heat absorbed by the tank 122 is transferred to the fins 124 and the liquid around the fins 124. The evaporating segments 192 of the heat pipes 19 receive the heat from the fins 124 and convey the heat to the condensing segments 196 distant from the heat-generating device 20. The condensing segments 196 discharge the heat to the liquid contained in the reservoir 14. The heat absorbed by the liquid contained in the reservoir 14 is further transferred to the ambient environment through the outer periphery and the protrusions 142 of the reservoir 14.

In the preferred embodiment, the liquid only needs to fill the cooling device 10, without circulation in the cooling device 10. Therefore, no great force is exerted on joints of different parts of the cooling device 10 by the liquid. Accordingly, cost to seal the cooling device 10 is low and the reliability of the sealing is high. Additionally, no pump is needed to drive the liquid to circulate in the cooling device 10. Thus, cost to provide a pump is eliminated. The cooling device 10 consumes no electric power during operation thereof.

The fins 124 of the heat sink 12 are completely submerged in the liquid. This enhances heat-exchange area between the heat sink 12 and the liquid. The protrusions 142 on the reservoir 14 enhances heat-exchange area between the reservoir 14 and the liquid, and prompts the reservoir 14 to dissipate heat to the ambient environment. The heat pipes 19 can quickly convey heat from a place near the heat-generating device 20 to another place remote from the heat-generating device 20. Since the heat pipes 19 are heat exchanged in liquid, the heat pipes 19 are not necessary to form with any U-turn in order to increase the areas of heat exchange.

The flexible tube 18 renders it facile to assemble or disassembly the cooling device 10 to the heat-generating device 20, due to the flexibility of the tube 18. The position of the heat sink 12 is adjustable due to the flexibility of the flexible tube 18, whereby the heat sink 12 can be more easily to be attached to the heat-generating device 20. Furthermore, if the heat-generating device 20 has a different height due to a manufacturing tolerance or different specifications, such a difference in height can be easily compensated by the adjustment of the position of the heat sink 12. Finally, in the present embodiment, only a minor part of weight of the liquid cooler device 10 is exerted to the heat-generating device 20 which is usually mounted on the printed circuit board 200; thus, the printed circuit board 200 for mounting the heat-generating device 20 is not subject to damage due to the weight of the liquid cooler device 10.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A liquid cooling device comprising:
    a heat sink;
    a reservoir distant from the heat sink;
    a duct connecting with the reservoir and a flexible tube connected to the duct, the duct and the flexible tube cooperatively connecting the heat sink and the reservoir to form a hermetical liquid container;
    liquid contained in the liquid container; and
    a heat pipe comprising a heat-absorbing segment disposed in the heat sink and a heat-discharging segment disposed in the reservoir and a medium segment between the heat-absorbing segment and the heat-discharging segment;
    wherein the heat sink comprises a plurality of fins extending from a side of the heat sink and being submerged in the liquid.

2. The liquid cooling device of claim 1, wherein the heat-absorbing segment is fixed to the fins of the heat sink.

3. The liquid cooling device of claim 2, wherein the heat-discharging segment of the heat pipe is freely extended in the reservoir.

4. The liquid cooling device of claim 1, wherein the flexible tube comprises an end which joins with the heat sink and encloses the fins of the heat sink.

5. A liquid cooling device comprising:
    a heat-receiving element;
    a heat-dissipating element remote from the heat-receiving element;
    a connecting element connecting the heat-receiving element and the heat-dissipating element to form a hermetical liquid container;
    liquid filling the liquid container; and
    a heat pipe submerged in the liquid and extending from the heat-receiving element to the heat-dissipating element to thereby transfer heat from the heat-receiving element to the heat-dissipating element;
    wherein the heat-receiving element comprises a heat-receiving portion and a plurality of fins extending from the heat-receiving portion, the fins being submerged in the liquid.

6. The liquid cooling device of claim 5, wherein the connecting element comprises a flexible portion along the connecting element to render a position of the heat-receiving element adjustable according to a position of the heat-dissipating element.

7. The liquid cooling device of claim 6, wherein the flexible portion of the connecting element is engaged with the heat-receiving portion and encloses the fins.

8. The liquid cooling device of claim 5, wherein the heat-dissipating element comprises a reservoir having a plurality of protrusions for enhancing heat-exchange area of the heat-dissipating element.

9. The liquid cooling device of claim 5, wherein the heat pipe is only fixed to one of the heat-receiving element and the heat-dissipating element.

10. A liquid cooling device, comprising:
    a reservoir;
    a flexible tube hermetically connecting with the reservoir; and a heat sink hermetically connecting with the flexible tube, adapted for thermal contact with a heat generating electronic device;

wherein the reservoir and the flexible tube are filled with liquid therein;

wherein the liquid cooling device further comprising at least a heat pipe having an evaporating end fixed to the heat sink and a condensing end extending in the reservoir; and wherein the heat sink has fins submerged in the liquid, and the evaporating end of the at least a heat pipe is fixed to the fins.

11. The liquid cooling device of claim 10, wherein the reservoir forms protrusions on its outer periphery for increasing heat-dissipating area of the reservoir.

12. The liquid cooling device of claim 10, wherein a duct is hermetically connected between the reservoir and the flexible tube, the duct has an end portion thereof perpendicularly inserted into the reservoir, and another end portion thereof parallel to a plane that the reservoir extends.

13. The liquid cooling device of claim 1, wherein the medium segment of the heat pipe is disposed in the liquid container and located in the duct.

14. The liquid cooling device of claim 5, wherein the heat pipe extends through the hermetical liquid container.

15. The liquid cooling device of claim 5, wherein the heat pipe is fixed to the fins of the heat-receiving element.

16. The liquid cooling device of claim 1, wherein the heat sink comprises a tank having an outer surface contacting a heat-generating device for absorbing heat therefrom, and the fins are extended out of the tank in a direction away from the outer surface of the tank.

* * * * *

UNITED STATES PATENT AND TRADEMARK OFFICE
CERTIFICATE OF CORRECTION

PATENT NO. : 7,631,686 B2
APPLICATION NO. : 11/211985
DATED : December 15, 2009
INVENTOR(S) : He et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 869 days.

Signed and Sealed this

Second Day of November, 2010

David J. Kappos
*Director of the United States Patent and Trademark Office*